(12) United States Patent
Vinokor et al.

(10) Patent No.: US 7,345,248 B2
(45) Date of Patent: Mar. 18, 2008

(54) ULTRA-LOW HEIGHT ELECTROMAGNETIC SHIELDING ENCLOSURE

(75) Inventors: Igor Vinokor, Skokie, IL (US); Vladislav Pirkhalo, Vernon Hills, IL (US); Anatoliy Shlahtichman, Buffalo Grove, IL (US); Eugene Smyk, Crystal Lake, IL (US); Zoilo Anthony Favela, Chicago, IL (US); Gerald English, Glen Ellyn, IL (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 11/854,586

(22) Filed: Sep. 13, 2007

(65) Prior Publication Data
US 2008/0000683 A1 Jan. 3, 2008

Related U.S. Application Data

(63) Continuation of application No. 11/495,995, filed on Jul. 28, 2006, now Pat. No. 7,285,732, which is a continuation of application No. 11/044,934, filed on Jan. 27, 2005, now Pat. No. 7,109,411.

(60) Provisional application No. 60/540,180, filed on Jan. 29, 2004.

(30) Foreign Application Priority Data
Jan. 27, 2005 (WO) ................ PCT/US2005/02997

(51) Int. Cl.
*H05K 9/00* (2006.01)
(52) U.S. Cl. ....................... 174/382; 174/377
(58) Field of Classification Search ............... 174/377, 174/382, 384, 387; 361/816, 818
See application file for complete search history.

(56) References Cited

U.S. PATENT DOCUMENTS

| 4,626,963 | A | * | 12/1986 | Speer ........................ 361/818 |
| 4,754,101 | A | | 6/1988 | Stickney et al. |
| 5,032,689 | A | | 7/1991 | Halligan et al. |
| 5,354,951 | A | | 10/1994 | Lange, Sr. et al. |
| 5,383,098 | A | | 1/1995 | Ma et al. |
| 5,400,949 | A | * | 3/1995 | Hirvonen et al. ...... 228/180.22 |
| 5,414,597 | A | * | 5/1995 | Lindland et al. ............ 361/816 |
| 5,422,433 | A | | 6/1995 | Rivera et al. |
| 5,436,802 | A | | 7/1995 | Trahan et al. |
| 5,530,202 | A | | 6/1996 | Dais et al. |

(Continued)

*Primary Examiner*—Hung V. Ngo
(74) *Attorney, Agent, or Firm*—Harness, Dickey & Pierce, P.L.C.

(57) ABSTRACT

A shielding enclosure generally includes a frame and a lid. The frame may include sidewalls, an inwardly extending horizontal lip defining an open top for the frame, generally horizontal flanges extending outwardly relative to the lip, and one or more openings disposed generally under the corresponding one or more flanges. The lid may include an upper surface to cover the frame's open top, a downwardly extending lip configured to at least partially fit generally over the frame's sidewalls, one or more openings, and one or more generally upwardly extending flanges having one or more lateral detent protrusions. The lid may be attached to the frame by the interlocking engagement of the lid's one or more lateral detent protrusions generally under the corresponding one or more flanges of the frame, which said one or more flanges of the frame are at least partially received through the corresponding one or more openings of the lid.

25 Claims, 4 Drawing Sheets

U.S. PATENT DOCUMENTS

| | | |
|---|---|---|
| 5,704,117 A | 1/1998 | Mok et al. |
| 6,235,985 B1 | 5/2001 | Dai |
| 6,362,417 B2 | 3/2002 | Mitchell et al. |
| 6,390,320 B2 | 5/2002 | Hurst et al. |
| 2005/0141211 A1 | 6/2005 | Chen |

* cited by examiner

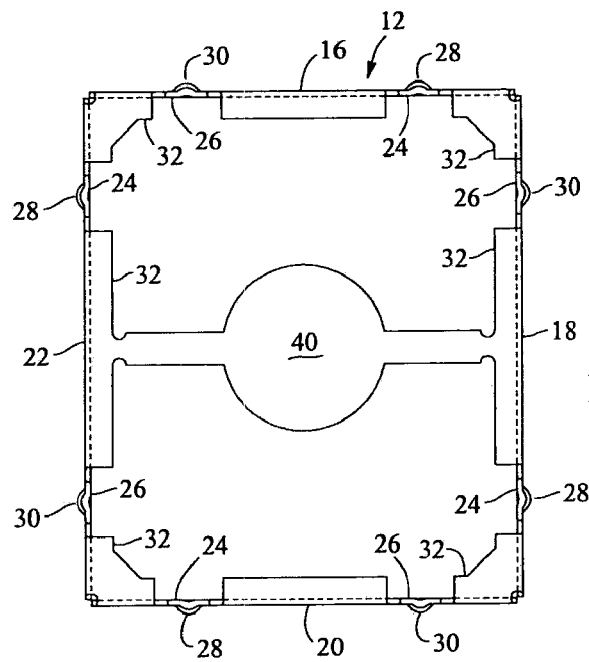
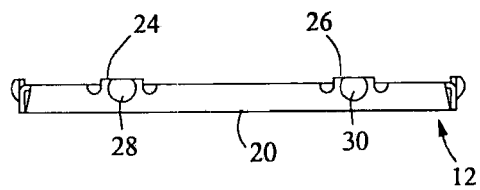
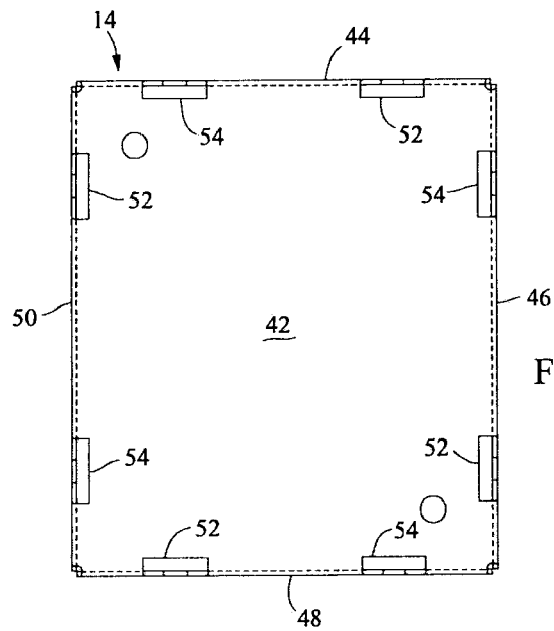
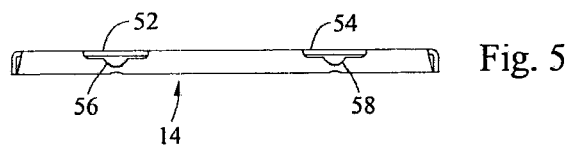

ULTRA-LOW HEIGHT ELECTROMAGNETIC SHIELDING ENCLOSURE

CROSS-REFERENCE TO RELATED APPLICATIONS

This application is a continuation of presently allowed U.S. patent application Ser. No. 11/495,995 filed Jul. 28, 2006.

U.S. patent application Ser. No. 11/495,995 is a continuation of U.S. patent application Ser. No. 11/044,934 filed Jan. 27, 2005 (now issued U.S. Pat. No. 7,109,411 issued Sep. 19, 2006), which, in turn, claimed priority to U.S. Provisional Patent Application No. 60/540,180 filed Jan. 29, 2004.

U.S. patent application Ser. No. 11/495,995 also claimed the benefit of PCT International Patent Application No. PCT/US2005/002997 filed Jan. 27, 2005, which, in turn, claimed priority to U.S. Provisional Patent Application No. 60/540,180 filed Jan. 29, 2004.

The disclosures of the above applications are incorporated herein by reference.

FIELD

The present disclosure generally relates multi-piece electromagnetic shielding assemblies including a frame and cover, which can used as an enclosure for shielding electromagnetic radiation from exiting or entering an electronics package of a printed circuit board.

BACKGROUND

The statements in this section merely provide background information related to the present disclosure and may not constitute prior art.

Electronic equipment typically includes electrical components and circuits mounted on a substrate that can be sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, thereby rendering the electronic equipment inefficient or inoperable. Accordingly, the circuits (sometimes referred to as RF modules or transceiver circuits) usually require EMI/RFI shielding in order to function properly. The shielding reduces interference not only from external sources, but also from various functional blocks within the module. By way of example, electronic circuits or components of a printed circuit board (PCB) are often enclosed with shields to localize EMI within its source, and to insulate other devices proximal to the EMI source.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of shielding enclosures. In one exemplary embodiment, a shielding enclosure generally includes a frame and a lid attachable to the frame. The frame includes sidewalls, an inwardly extending horizontal lip defining an open top for the frame, generally horizontal flanges extending outwardly relative to the lip, and one or more openings disposed generally under the corresponding one or more flanges. The lid includes an upper surface to cover the frame's open top, a downwardly extending lip configured to at least partially fit generally over the frame's sidewalls, one or more openings, and one or more generally upwardly extending flanges having one or more lateral detent protrusions. The lid may be attached to the frame by the interlocking engagement of the lid's one or more lateral detent protrusions generally under the corresponding one or more flanges of the frame, which said one or more flanges of the frame are at least partially received through the corresponding one or more openings of the lid.

In another exemplary embodiment, a shielding enclosure generally includes a frame and a lid attachable to the frame. The frame includes sidewalls with upstanding elements having one or more apertures, and an inwardly extending horizontal lip defining an open top for the frame. The lid includes an upper surface to cover the frame's open top, a downwardly extending lip configured to at least partially fit generally over the frame's sidewalls, at least opening corresponding to each of the frame's upstanding elements, and upwardly extending flanges having one or more lateral detent protrusions. The lid's upwardly extending flanges are configured to align outwardly adjacent the corresponding upstanding elements of the frame with the one or more lateral detent protrusions engaging the corresponding one or more apertures of the frame and with the frame's upstanding elements received within the corresponding one or more openings of the lid, to thereby attach the lid to the frame.

In another exemplary embodiment, a shielding enclosure generally includes a frame and a cover attachable to the frame. The frame includes sidewalls having elements that extend upwardly above the top of the frame, which elements have at least one of an opening and a lateral detent protrusion. The cover includes a downwardly extending lip having flanges extending upwardly therefrom, which flanges have at least one of the other of said opening and lateral detent protrusion. Each lateral detent protrusion is engagingly receivable in a corresponding opening, to thereby retain the cover on the frame.

Other aspects relate to methods, such as methods of making and/or using shielding enclosures. One exemplary embodiment is generally directed to a method of using a shielding enclosure that includes a frame and a lid. The frame includes sidewalls, an inwardly extending horizontal lip defining an open top for the frame, generally horizontal flanges extending outwardly relative to the lip, and one or more openings disposed generally under the corresponding one or more flanges. The lid includes an upper surface, a downwardly extending lip, one or more openings, and one or more generally upwardly extending flanges having one or more lateral detent protrusions. In this exemplary embodiment, the method generally includes positioning the lid relative to the frame such that the lid's upper surface covers the open top of the frame, the lid's downwardly extending lip at least partially fits generally over the frame's sidewalls, the frame's one or more flanges are at least partially received through the corresponding one or more openings of the lid, and the lid's one or more lateral detent protrusions interlockingly engage generally under the corresponding one or more flanges of the frame, thereby retaining the lid to the frame.

Another exemplary embodiment includes a method of making a shielding enclosure having a frame and a lid. In this embodiment, the method generally includes forming a frame such that the frame includes sidewalls, an inwardly extending horizontal lip defining an open top for the frame, generally horizontal flanges extending outwardly relative to the lip, and one or more openings disposed generally under the corresponding one or more flanges. The method also includes forming a lid such that the lid includes an upper surface to cover the frame's open top, a downwardly extending lip configured to at least partially fit generally over the frame's sidewalls, one or more openings, and one or more generally upwardly extending flanges having one or more lateral detent protrusions. The lid may be attached to the frame by the interlocking engagement of the lid's one or more lateral detent protrusions generally under the corresponding one or more flanges of the frame, which said one or more flanges of the frame are at least partially received through the corresponding one or more openings of the lid.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

FIG. 2 is a top plan view of the frame shown in FIG. 1A;

FIG. 3 is a plan view of the front of the frame shown in FIG. 1A;

FIG. 4 is a top plan view of the lid shown in FIG. 1A;

FIG. 5 is a plan view of the front of the lid shown in FIG. 1A;

DETAILED DESCRIPTION

Figure 1A:
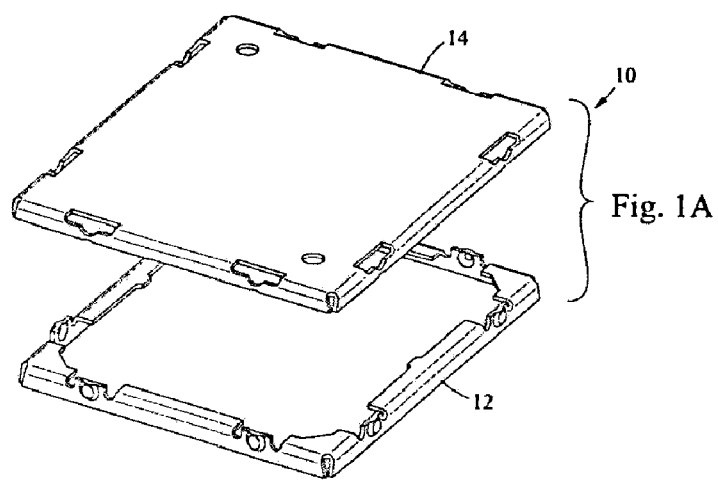
FIG. 1A is an exploded view of a lid and frame of a shielding device according to a first exemplary embodiment.
Figure 1B:
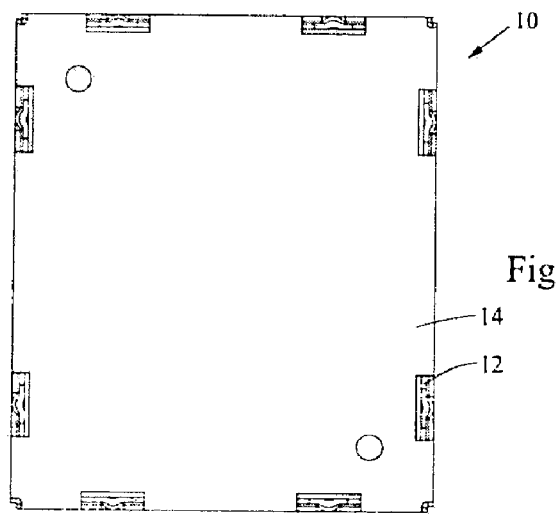
FIG. 1B is a top plan view of the engaged lid and frame of the shielding device shown in FIG. 1A.
Figure 1C:
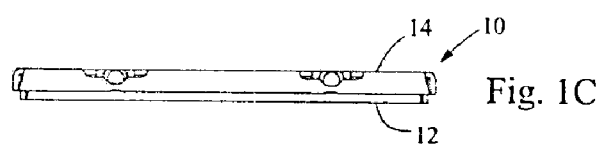
FIG. 1C is a side plan view of the engaged lid and frame of the shielding device shown in FIG. 1A.
Figure 1D:
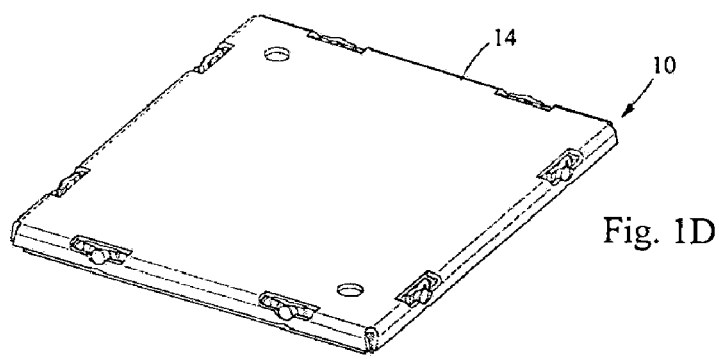
FIG. 1D is a perspective view of the engaged lid and frame of the shielding device shown in FIG. 1A.

The following description is merely exemplary in nature and is in no way intended to limit the present disclosure, application, or uses. It should be understood that throughout the drawings, corresponding reference numerals indicate like or corresponding parts and features.

According to various aspects, exemplary embodiments are provided of shielding enclosures. In one exemplary embodiment, a shielding enclosure generally includes a frame and a lid attachable to the frame. The frame includes sidewalls, an inwardly extending horizontal lip defining an open top for the frame, generally horizontal flanges extending outwardly relative to the lip, and one or more openings disposed generally under the corresponding one or more flanges. The lid includes an upper surface to cover the frame's open top, a downwardly extending lip configured to at least partially fit generally over the frame's sidewalls, one or more openings, and one or more generally upwardly extending flanges having one or more lateral detent protrusions. The lid may be attached to the frame by the interlocking engagement of the lid's one or more lateral detent protrusions generally under the corresponding one or more flanges of the frame, which said one or more flanges of the frame are at least partially received through the corresponding one or more openings of the lid.

In another exemplary embodiment, a shielding enclosure generally includes a frame and a lid attachable to the frame. The frame includes sidewalls with upstanding elements having one or more apertures, and an inwardly extending horizontal lip defining an open top for the frame. The lid includes an upper surface to cover the frame's open top, a downwardly extending lip configured to at least partially fit generally over the frame's sidewalls, at least opening corresponding to each of the frame's upstanding elements, and upwardly extending flanges having one or more lateral detent protrusions. The lid's upwardly extending flanges are configured to align outwardly adjacent the corresponding upstanding elements of the frame with the one or more lateral detent protrusions engaging the corresponding one or more apertures of the frame and with the frame's upstanding elements received within the corresponding one or more openings of the lid, to thereby attach the lid to the frame.

In another exemplary embodiment, a shielding enclosure generally includes a frame and a cover attachable to the frame. The frame includes sidewalls having elements that extend upwardly above the top of the frame, which elements have at least one of an opening and a lateral detent protrusion. The cover includes a downwardly extending lip having flanges extending upwardly therefrom, which flanges have at least one of the other of said opening and lateral detent protrusion. Each lateral detent protrusion is engagingly receivable in a corresponding opening, to thereby retain the cover on the frame.

Other aspects relate to methods, such as methods of making and/or using shielding enclosures. One exemplary embodiment is generally directed to a method of using a shielding enclosure that includes a frame and a lid. The frame includes sidewalls, an inwardly extending horizontal lip defining an open top for the frame, generally horizontal flanges extending outwardly relative to the lip, and one or more openings disposed generally under the corresponding one or more flanges. The lid includes an upper surface, a downwardly extending lip, one or more openings, and one or more generally upwardly extending flanges having one or more lateral detent protrusions. In this exemplary embodiment, the method generally includes positioning the lid relative to the frame such that the lid's upper surface covers the open top of the frame, the lid's downwardly extending lip at least partially fits generally over the frame's sidewalls, the frame's one or more flanges are at least partially received through the corresponding one or more openings of the lid, and the lid's one or more lateral detent protrusions interlockingly engage generally under the corresponding one or more flanges of the frame, thereby retaining the lid to the frame.

Another exemplary embodiment includes a method of making a shielding enclosure having a frame and a lid. In this embodiment, the method generally includes forming a frame such that the frame includes sidewalls, an inwardly extending horizontal lip defining an open top for the frame, generally horizontal flanges extending outwardly relative to the lip, and one or more openings disposed generally under the corresponding one or more flanges. The method also includes forming a lid such that the lid includes an upper surface to cover the frame's open top, a downwardly extending lip configured to at least partially fit generally over the frame's sidewalls, one or more openings, and one or more generally upwardly extending flanges having one or more lateral detent protrusions. The lid may be attached to the frame by the interlocking engagement of the lid's one or more lateral detent protrusions generally under the corresponding one or more flanges of the frame, which said one or more flanges of the frame are at least partially received through the corresponding one or more openings of the lid.

Accordingly, various embodiments are disclosed herein that can provide electromagnetic interference shielding for one or more electrical components on a printed circuit board (or other substrate). Some exemplary embodiments provide a shielding device having a very low height from the printed circuit board, particularly when used with mobile handsets or similar applications where there is typically not enough room for devices with a greater height. Some exemplary embodiments provide a shielding device wherein reduced stress is placed on the device during assembly. Some exemplary embodiments provide shielding devices that can be manufactured and assembled with relatively low manufacturing and assembly costs low.

In one exemplary embodiment, a shielding device generally includes a frame and a lid. The height of the shielding device may be as low as 0.9 millimeter, and may typically be 1.4 millimeters. The frame may include four sidewalls that extend upwardly from the printed circuit board and include male detent elements or protrusions. A top or upper portion of the frame is generally open with a support extending thereacross. The lid has roughly the same footprint as the frame, with a planar top and a peripheral downwardly extending lip that engages the top or upper periphery of the frame. Slots may be formed in the intersection between the planar top and the downwardly extending lip. These slots of the lid may be engaged by the male detent protrusions of the frame in the installed position. Variations in the detent engagement are also disclosed herein.

Referring now to FIGS. 1A through 1D, there is shown various views of a first exemplary embodiment of a shielding device 10 embodying one or more aspects of the present disclosure. As shown, the shielding device 10 includes a frame 12 and a lid 14 engageable to the frame 12. The frame 12 and lid 14 are typically formed from electrically conductive sheet metal or other suitable materials.

The frame 12 is shown in more detail in FIGS. 2 and 3. In this particular illustrated embodiment, the frame 12 includes four upright sidewalls 16, 18, 20, 22 in a generally rectangular or square configuration and is configured to attach on its lower side to a circuit board (not shown) so as to surround the electromagnetic device (not shown) being shielded. Sidewalls 16, 18, 20, 22 may have a height to provide a total shielding device height as low as 0.9 millimeter. But the shielding device 10 may have a typical height of 1.4 millimeter. Each sidewall 16, 18, 20, 22 includes two upstanding male detent elements 24, 26 with respective outwardly extending protrusions 28, 30. Furthermore, inwardly extending lip 32 is formed about the periphery of the top of sidewalls 16, 18, 20, 22 except for the areas where the material is used to form the upstanding male detent elements 24, 26. Support beam 40 is formed across the open top of frame 12. Typically, all parts of frame 12 are integral and formed from a single piece of the electrically conductive sheet metal.

The lid 14 is shown in more detail in FIGS. 4 and 5. In this particular illustrated embodiment, the lid 14 includes a generally planar top 42 and downwardly extending lip portions 44, 46, 48, 50 that fit outwardly adjacently flush to the frame's sidewalls 16, 18, 20, 22, respectively, in the installed position. Slots 52, 54 are formed at the intersection of the planar top 42 and each downwardly extending lip portion 44, 46, 48, 50. As can be seen from FIGS. 4 and 5, slots 52, 54 extend into the lip portions 44, 46, 48, 50. Typically, slots 52, 54 would have a minimum width of 2.0 millimeters. As can be seen in FIG. 5, the portion of slots 52, 54 extending into lip portions 44, 46, 48, 50 has a central semi-circular cut-out portion 56, 58, respectively, for nesting with the outwardly extending protrusions 28, 30. Cut-outs can be formed on the lower edge of lid 14, aligned with slots 52, 54, respectively, for example, to help align the lid 14 during installation.

Figure 6:
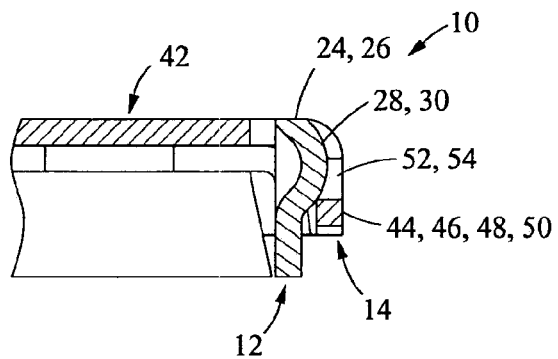
FIG. 6 is a cross-sectional view illustrating the engagement between the frame and the lid of the shielding device shown in FIG. 1A.

As shown in FIG. 6, in the installed position wherein frame 12 and lid 14 are engaged, upstanding male detent elements 24, 26 extend into slots 52, 54 and outwardly extending protrusions 28, 30 extend laterally into slots 52, 54 to detent engage the frame 12 and lid 14 to each other.

Figure 7:
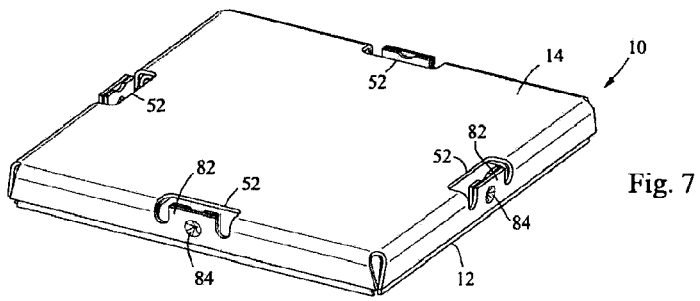
FIG. 7 is a perspective view of an engaged lid and frame of a shielding device according to a second exemplary embodiment.
Figure 8:
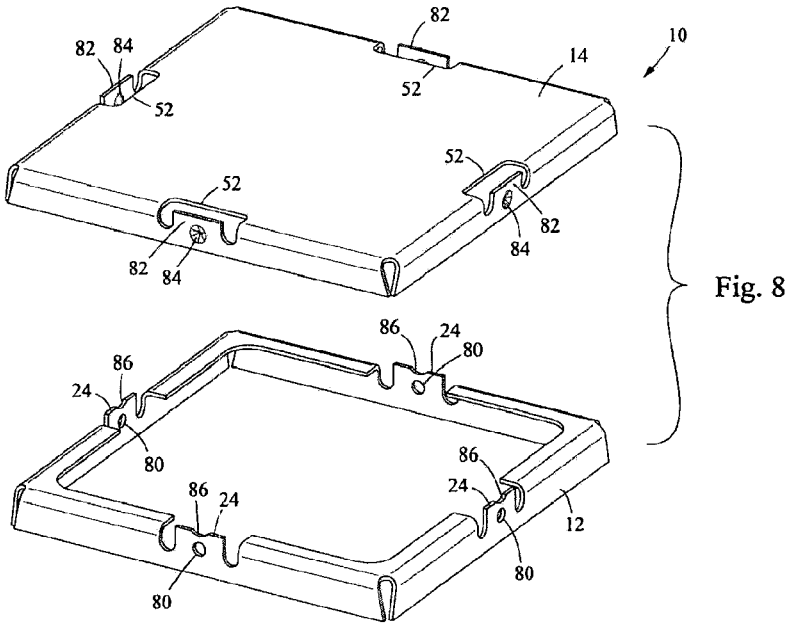
FIG. 8 is an exploded view of the lid and frame of the shielding device shown in FIG. 7.
Figure 9:
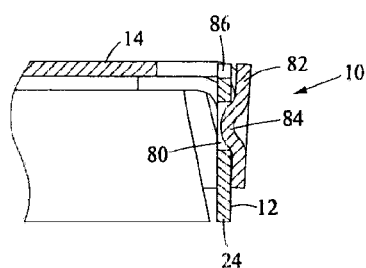
FIG. 9 is a cross-sectional view illustrating the engagement between the lid and frame of the shielding device shown in FIG. 7.

FIGS. 7 through 9 illustrate a second exemplary embodiment of a shielding device 10 embodying one or more aspects of the present disclosure. As shown for the second embodiment of the shielding device 10, at least one upstanding male detent element 24 is on each sidewall of frame 12, and at least one slot 52 corresponding to each upstanding male detent element 24 is on each sidewall of lid 14. Each upstanding male detent element 24 includes aperture 80. Each slot 52 has flange 82 adjacent thereto, including dimple 84. The detent configuration between the frame 12 and lid 14 is formed by flange 82 aligning outwardly adjacent from upstanding male element 24 and dimple 84 extending into aperture 80. Cut-outs 86 are on the top surface of upstanding male detent element 24 to aid in aligning dimples 84 during installation.

Figure 10:
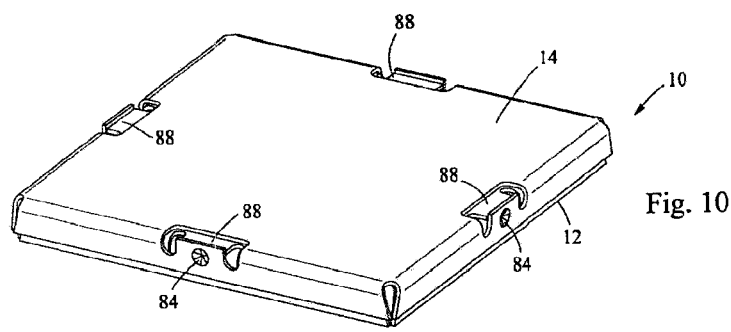
FIG. 10 is a perspective view of an engaged lid and frame of a shielding device according to a third exemplary embodiment.
Figure 11:
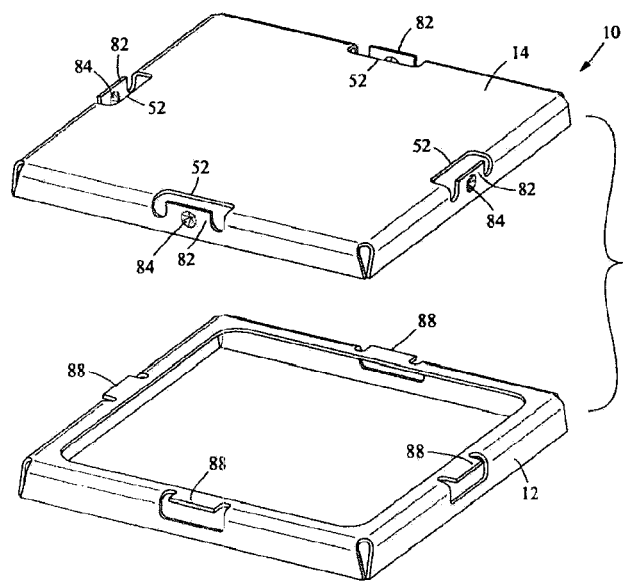
FIG. 11 is an exploded view of the lid and frame of the shielding device shown in FIG. 10.
Figure 12:
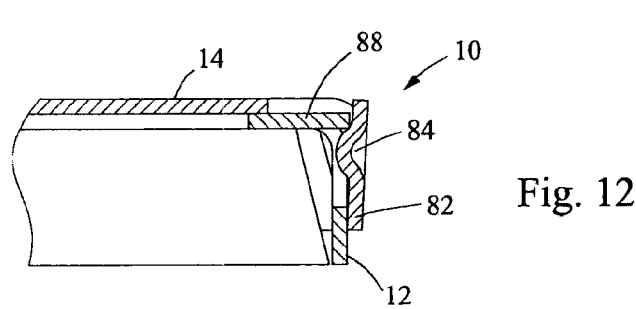
FIG. 12 is a cross-sectional view illustrating the engagement between the lid and frame of the shielding device shown in FIG. 10.
Figure 13:
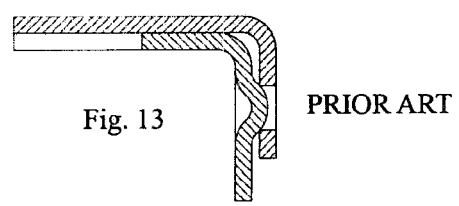
FIG. 13 is a cross-sectional view illustrating the engagement between a frame and lid of a prior art shielding device.
Figure 14:
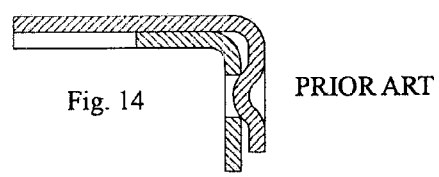
FIG. 14 is a cross-sectional view illustrating the engagement between a frame and lid of another prior art shielding device.

FIGS. 10 through 12 illustrate a third exemplary embodiment of a shielding device 10 embodying one or more aspects of the present disclosure. As shown for the third embodiment of the shielding device 10, the lid 14 is substantially identical to that of the second embodiment shown in FIGS. 7 through 9. But the frame's upstanding male detent elements 24 (from the second embodiment) have been replaced with horizontal flange 88 in the third embodiment. As shown in FIG. 12, the installed position of the third embodiment includes dimple 84 extending inwardly under horizontal flange 88.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A shielding enclosure comprising:
   a frame including sidewalls, an inwardly extending horizontal lip defining an open top for the frame, generally horizontal flanges extending outwardly relative to the lip, and one or more openings disposed generally under the corresponding one or more flanges; and
   a lid including an upper surface to cover the frame's open top, a downwardly extending lip configured to at least partially fit generally over the frame's sidewalls, one or more openings, and one or more generally upwardly extending flanges having one or more lateral detent protrusions;
   wherein the lid is attachable to the frame by the interlocking engagement of the lid's one or more lateral detent protrusions generally under the corresponding one or more flanges of the frame, which said one or more flanges of the frame are at least partially received through the corresponding one or more openings of the lid.

2. The shielding enclosure of claim 1, wherein at least one of the lid's one or more lateral detent protrusions comprises an inwardly extending dimple.

3. The shielding enclosure of claim 1, wherein the lid's one or more openings are cooperatively defined by corresponding portions of the lid's upper surface, lip, and one or more flanges.

4. The shielding enclosure of claim 1, wherein the frame's one or more flanges, sidewalls, and lip are integrally formed from a single piece of material such that the frame has a monolithic construction.

5. The shielding enclosure of claim 1, wherein the frame's one or more flanges are generally coplanar with the frame's lip.

6. The shielding enclosure of claim 1, wherein the lid's upper surface, lip, one or more openings, one or more flanges, and one or more lateral detent protrusions are integrally formed from a single piece of material such that the lid has a monolithic construction.

7. The shielding enclosure of claim 1, wherein the lid's one or more flanges do not extend upwardly beyond the lid's upper surface.

8. The shielding enclosure of claim 1, wherein each of the lid's one or more flanges includes only one of said lateral detent protrusions.

9. An electronic device comprising the shielding enclosure of claim 1.

10. The shielding enclosure of claim 1, wherein, after the lid's lateral detent protrusions are interlockingly engaged generally under the frame's flanges, the frame and the lid have a combined height not exceeding 1.4 millimeter.

11. The shielding enclosure of claim 1, wherein, after the lid's lateral detent protrusions are interlockingly engaged generally under the frame's flanges, the frame and the lid have a combined height not exceeding 0.9 millimeter.

12. A shielding enclosure comprising:
    a frame including sidewalls with upstanding elements having one or more apertures, and an inwardly extending horizontal lip defining an open top for the frame;
    a lid including an upper surface to cover the frame's open top, a downwardly extending lip configured to at least partially fit generally over the frame's sidewalls, at least opening corresponding to each of the frame's upstanding elements, and upwardly extending flanges having one or more lateral detent protrusions,
    wherein the lid's upwardly extending flanges are configured to align outwardly adjacent the corresponding upstanding elements of the frame with the one or more lateral detent protrusions engaging the corresponding one or more apertures of the frame and with the frame's upstanding elements received within the corresponding one or more openings of the lid, to thereby attach the lid to the frame.

13. The shielding enclosure of claim 12, wherein at least one of the lid's one or more lateral detent protrusions comprises a dimple.

14. The shielding enclosure of claim 13, wherein the frame includes at least one cut-out portion at the top surface of at least one of the frame's upstanding elements that is configured to aid in aligning the dimple with the corresponding aperture of the frame during installation of the lid to the frame.

15. An electronic device comprising the shielding enclosure of claim 12.

16. A shielding enclosure comprising:
    a frame including sidewalls having elements that extend upwardly above the top of the frame, which elements have at least one of an opening and a lateral detent protrusion; and
    a cover including a downwardly extending lip having flanges extending upwardly therefrom, which flanges have at least one of the other of said opening and lateral detent protrusion, wherein each lateral detent protrusion is engagingly receivable in a corresponding opening, to thereby retain the cover on the frame.

17. The shielding enclosure of claim 16, wherein each element of the frame includes at least one lateral detent protrusion, and wherein each flange of the cover includes at least one opening in which the corresponding lateral detent protrusion nests.

18. The shielding enclosure of claim 16, wherein each element of the frame includes at least one opening, and wherein each flange of the cover includes at least one lateral detent protrusion that nests within the corresponding opening.

19. The shielding enclosure of claim 16, wherein at least one lateral detent protrusion comprises a dimple.

20. An electronic device comprising the shielding enclosure of claim 16.

21. A method relating to a shielding enclosure including a frame and a lid, the frame including sidewalls, an inwardly extending horizontal lip defining an open top for the frame, generally horizontal flanges extending outwardly relative to the lip, and one or more openings disposed generally under the corresponding one or more flanges, the lid including an upper surface, a downwardly extending lip, one or more openings, and one or more generally upwardly extending flanges having one or more lateral detent protrusions, the method comprising:
   positioning the lid relative to the frame such that:
      the lid's upper surface covers the open top of the frame;
      the lid's downwardly extending lip at least partially fits generally over the frame's sidewalls;
      the frame's one or more flanges are at least partially received through the corresponding one or more openings of the lid; and
      the lid's one or more lateral detent protrusions interlockingly engage generally under the corresponding one or more flanges of the frame, thereby retaining the lid to the frame.

22. The method of claim 21, further comprising installing the shielding enclosure to a board having one or more electrical components such that the one more electrical components are generally enclosed within an interior cooperatively defined by the frame, lid, and board, to thereby provide board level shielding for the one or more electrical components.

23. A method of making a shielding enclosure having a frame and a lid, the method comprising:
   forming a frame such that the frame includes sidewalls, an inwardly extending horizontal lip defining an open top for the frame, generally horizontal flanges extending outwardly relative to the lip, and one or more openings disposed generally under the corresponding one or more flanges; and
   forming a lid such that the lid includes an upper surface to cover the frame's open top, a downwardly extending lip configured to at least partially fit generally over the frame's sidewalls, one or more openings, and one or more generally upwardly extending flanges having one or more lateral detent protrusions;
   whereby the lid is attachable to the frame by the interlocking engagement of the lid's one or more lateral detent protrusions generally under the corresponding one or more flanges of the frame, which said one or more flanges of the frame are at least partially received through the corresponding one or more openings of the lid.

24. The method of claim 23, wherein forming the frame includes integrally forming the frame's one or more flanges, sidewalls, and lip from a single piece of material such that the frame has a monolithic construction.

25. The method of claim 23, wherein forming the lid includes integrally forming the lid's upper surface, lip, one or more openings, one or more flanges, and one or more lateral detent protrusions from a single piece of material such that the lid has a monolithic construction.

* * * * *